United States Patent
Liang et al.

(10) Patent No.: US 10,192,954 B2
(45) Date of Patent: Jan. 29, 2019

(54) JUNCTIONLESS NANOWIRE TRANSISTOR AND MANUFACTURING METHOD FOR THE SAME

(71) Applicant: Wuhan China Star Optoelectronics Technology Co., Ltd., Wuhan, Hubei (CN)

(72) Inventors: Bo Liang, Guangdong (CN); Jun Li, Guangdong (CN); Wei Wang, Guangdong (CN)

(73) Assignee: Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 99 days.

(21) Appl. No.: 15/314,057

(22) PCT Filed: Nov. 16, 2016

(86) PCT No.: PCT/CN2016/106039
§ 371 (c)(1),
(2) Date: Nov. 25, 2016

(87) PCT Pub. No.: WO2018/082118
PCT Pub. Date: May 11, 2018

(65) Prior Publication Data
US 2018/0197952 A1    Jul. 12, 2018

(30) Foreign Application Priority Data
Nov. 3, 2016   (CN) .................... 2016 1 09574566

(51) Int. Cl.
*H01L 29/06* (2006.01)
*H01L 29/10* (2006.01)
(Continued)

(52) U.S. Cl.
CPC .......... *H01L 29/0673* (2013.01); *B82Y 10/00* (2013.01); *H01L 21/3065* (2013.01);
(Continued)

(58) Field of Classification Search
CPC .......... H01L 29/0673; H01L 29/42392; H01L 29/78696; H01L 29/775; H01L 29/66439; H01L 29/785
(Continued)

(56) References Cited

U.S. PATENT DOCUMENTS 9,034,717 B2   5/2015  Colinge
9,431,512 B2 * 8/2016  Koh ................ B82Y 10/00
(Continued)

FOREIGN PATENT DOCUMENTS

CN           102916048 A    2/2013

*Primary Examiner* — Jonathan Han
(74) *Attorney, Agent, or Firm* — Andrew C. Cheng

(57) ABSTRACT

A junctionless nanowire transistor and a manufacturing method for the same are disclosed. Two terminals of each of the channel nanowires disposed in the transistor are respectively connected with the source region and the drain region; the source region, the drain region and the channel nanowires uses a same doping material such that the on-state current of the transistor is increased, and the uniformity of the transistor is increased. Besides, the multiple channel nanowires are disposed above the active layer in a stacked arrangement to increase the integration of the transistor.

19 Claims, 6 Drawing Sheets

(51) Int. Cl.
| | |
|---|---|
| H01L 21/308 | (2006.01) |
| H01L 29/786 | (2006.01) |
| H01L 29/08 | (2006.01) |
| H01L 29/423 | (2006.01) |
| H01L 21/3065 | (2006.01) |
| H01L 29/417 | (2006.01) |
| H01L 21/762 | (2006.01) |
| H01L 29/66 | (2006.01) |
| B82Y 10/00 | (2011.01) |
| H01L 29/775 | (2006.01) |
| H01L 21/02 | (2006.01) |
| H01L 21/324 | (2006.01) |
| H01L 21/3105 | (2006.01) |

(52) U.S. Cl.
CPC ........ *H01L 21/3086* (2013.01); *H01L 21/762* (2013.01); *H01L 29/0649* (2013.01); *H01L 29/0847* (2013.01); *H01L 29/1033* (2013.01); *H01L 29/41733* (2013.01); *H01L 29/42392* (2013.01); *H01L 29/6675* (2013.01); *H01L 29/66439* (2013.01); *H01L 29/775* (2013.01); *H01L 29/78663* (2013.01); *H01L 21/0262* (2013.01); *H01L 21/02271* (2013.01); *H01L 21/02422* (2013.01); *H01L 21/02532* (2013.01); *H01L 21/02592* (2013.01); *H01L 21/31053* (2013.01); *H01L 21/324* (2013.01)

(58) Field of Classification Search
USPC ............... 257/9, E29.255, E21.409, 24, 347; 438/151, 197
See application file for complete search history.

(56) References Cited

U.S. PATENT DOCUMENTS

| | | | | |
|---|---|---|---|---|
| 2009/0065852 | A1* | 3/2009 | Lin | H01L 21/28282 257/326 |
| 2013/0161756 | A1* | 6/2013 | Glass | H01L 29/66545 257/369 |
| 2013/0279145 | A1* | 10/2013 | Then | H01L 29/66431 361/820 |
| 2014/0091360 | A1* | 4/2014 | Pillarisetty | H01L 21/8258 257/190 |
| 2014/0353574 | A1* | 12/2014 | Li | H01L 29/0673 257/9 |

* cited by examiner

JUNCTIONLESS NANOWIRE TRANSISTOR AND MANUFACTURING METHOD FOR THE SAME

BACKGROUND OF THE INVENTION

1. Field of the Invention

The present invention relates to the semiconductor device field, and more particularly to a junctionless nanowire transistor and a manufacturing method for the same.

2. Description of Related Art

The uniformity of the conventional PN junction complementary metal oxide semiconductor transistor is easily affected by the factors of the size difference of the semiconductor size, the resistance difference because of doping and an actual channel difference, which is harmful for the integration and miniaturization of the device formed by the above transistor structure.

SUMMARY OF THE INVENTION

The main technology problem solved by the present invention is to provide a junctionless nanowire transistor and manufacturing for the same in order to improve the uniformity of the transistor and the integration of the transistor.

The present invention provides a junctionless nanowire transistor, comprising: an active layer, a barrier layer, a source region, a source electrode, a drain region, a drain electrode, a gate electrode, first insulation medium and at least two channel nanowires;

wherein, the source region and the drain region are disposed on the active layer; the at least two channel nanowires are disposed above the active layer in a stacked arrangement, and two terminals of each of the at least two channel nanowires are respectively connected with the source region and the drain region; the barrier layer is located at a side of the active layer away from the source region and the drain region; the source electrode and the drain electrode are respectively disposed on the source region and the drain region; the first insulation medium is disposed between the at least two channel nanowires and the gate electrode; the source region, the drain region and the at least two channel nanowires uses a same doping material; and the source electrode, the drain electrode and the gate electrode are manufactured by a same material.

Wherein, the first insulation medium surrounds the at least two channel nanowires; and the gate electrode completely wraps the first insulation medium.

Wherein, the transistor further comprises a second insulation medium, and the second insulation medium are respectively disposed on the active layer and two sides of the gate electrode.

Wherein, the second insulation medium is an oxide-nitride-oxide structure.

The present invention provides another junctionless nanowire transistor, comprising: an active layer, a source region, a source electrode, a drain region, a drain electrode, a gate electrode, first insulation medium and at least two channel nanowires;

wherein, the source region and the drain region are disposed on the active layer; the at least two channel nanowires are disposed above the active layer in a stacked arrangement, and two terminals of each of the at least two channel nanowires are respectively connected with the source region and the drain region; the source region, the drain region and the at least two channel nanowires uses a same doping material; the source electrode and the drain electrode are respectively disposed on the source region and the drain region; and the first insulation medium is disposed between the at least two channel nanowires and the gate electrode.

Wherein, the first insulation medium surrounds the at least two channel nanowires; and the gate electrode completely encloses the first insulation medium.

Wherein, the transistor further comprises a second insulation medium, and the second insulation medium are respectively disposed on the active layer and two sides of the gate electrode.

Wherein, the second insulation medium is an oxide-nitride-oxide structure.

Wherein, the source electrode, the drain electrode and the gate electrode are manufactured by a same material.

Wherein, the transistor further comprises a barrier layer, and the barrier layer is located at a side of the active layer away from the source region and the drain region.

The present invention provides a manufacturing method for junctionless nanowire transistor, comprising step of:

preparing a base body;

etching the base body in order to form an active layer, a source region, a drain region and at least two channel nanowires, wherein, the source region, the drain region are disposed on the active layer, the at least two channel nanowires are disposed on the active layer in a stacked arrangement, and two terminals of each of the least two channel nanowires are respectively connected with the source region and the drain region; and respectively forming a source electrode and a drain electrode on the source region and the drain region, and sequentially forming a first insulation medium and a gate electrode outside the at least two channel nanowires such that the first insulation medium is disposed between the at least two channel nanowires and the gate electrode.

Wherein, the first insulation medium surrounds the at least two channel nanowires; and the gate electrode completely encloses the first insulation medium.

Wherein, the source electrode, the drain electrode and the gate electrode are manufactured by a same material.

Wherein, before the step of preparing a base body, the method further comprises a step of: forming a barrier layer, and the barrier layer is located at a side of the active layer away from the source region and the drain region.

Wherein, after the step of etching the base body in order to form an active layer, a source region, a drain region and at least two channel nanowires and before the step of respectively forming a source electrode and a drain electrode on the source region and the drain region, and sequentially forming a first insulation medium and a gate electrode outside the at least two channel nanowires such that the first insulation medium is disposed between the at least two channel nanowires and the gate electrode, the method further comprises steps of: removing an etching protection layer; and forming a second insulation medium, and arranging the second insulation medium at the active layer and two sides of the gate electrode.

Wherein, the second insulation medium is an oxide-nitride-oxide structure.

Wherein, after the step of preparing a base body and before the step of etching the base body in order to form an active layer, a source region, a drain region and at least two channel nanowires, the method further comprises a step of: forming an etching protection layer.

Wherein, the number of the cycles for etching the base body decides the number of the channel nanowires obtained.

The beneficial effects of the present invention are: comparing to the conventional art, the junctionless nanowire transistor and manufacturing for the same increases the on-state current of the transistor through disposing multiple channel nanowires; reduces the volume of the transistor through disposing the multiple channel nanowires in a stacked arrangement; solve the uniformity problem affected by the factors of the size difference of the semiconductor device size, the resistance difference because of doping and an actual channel difference through two terminals of each of the multiple channel nanowires respectively connecting the source region, the drain region, and through the same type doping to the source region and the drain region. At the same time, reducing the volume of the transistor through disposing the multiple channel nanowires above the active layer in a stacked arrangement in order to increase the integration of the transistor.

DETAILED DESCRIPTION OF THE PREFERRED EMBODIMENT

Figure 1:
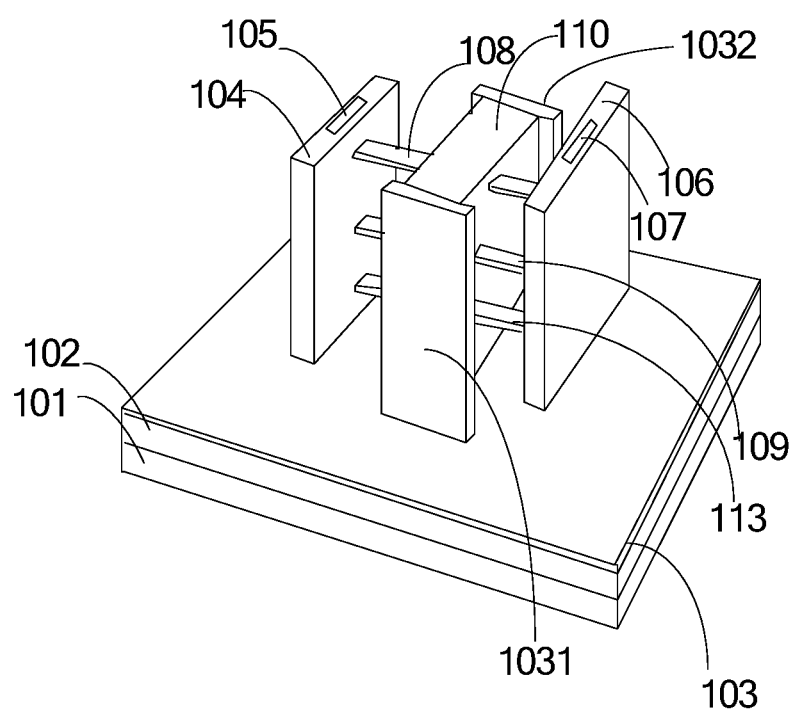
FIG. 1 is a schematic diagram of a junctionless nanowire transistor of the present invention according to an embodiment of the present invention.

With reference to FIG. 1, the junctionless nanowire transistor of the present embodiment includes an active layer 102, a source region 104, a source electrode 105, a drain region 106, a drain electrode 107, at least two channel nanowires 108, 109 and 113, a gate electrode 110 and a first insulation medium 111 (not shown).

Wherein, the source region 104 and the drain region 106 are disposed on the active layer 102. The at least two channel nanowires 108, 109, 113 are disposed above the active layer 102 in a stacked arrangement, and two terminals of each of the at least two channel nanowires 108, 109, 113 are respectively connected with the source region 104 and the drain region 106; the source region 104, the drain region 106 and the at least two channel nanowires 108, 109, 113 are using a same doping material; the source electrode 105 and the drain electrode 107 are respectively disposed on the source region 104 and the drain region 106. The first insulation medium 111 is disposed between the at least two channel nanowires 108, 109, 113 and the gate electrode 110.

Furthermore, in the present embodiment, the source electrode 105, the drain electrode 107 and the gate electrode 110 are manufactured by a same material. The first insulation medium 111 surrounds the at least two channel nanowires 108, 109, 113.

In an application, the gate electrode 110 completely encloses the first insulation medium 111. In another application, the arrangement method of the gate electrode 110 can be adopted according to a specific function requirement of the transistor.

Besides, the present embodiment further includes a barrier layer 101 and a second insulation medium 103, 1031, 1032. Wherein, the barrier layer 101 is located on a glass substrate or a polyimide (PI) film mainly for resisting a current leakage when the active layer 102 is performing an ion implantation. Besides, the active layer 102 is located on the barrier layer 101. The second insulation medium 103, 1031, 1032 are respectively disposed on the active layer 102 and two sides of the gate electrode 110.

Figure 2:
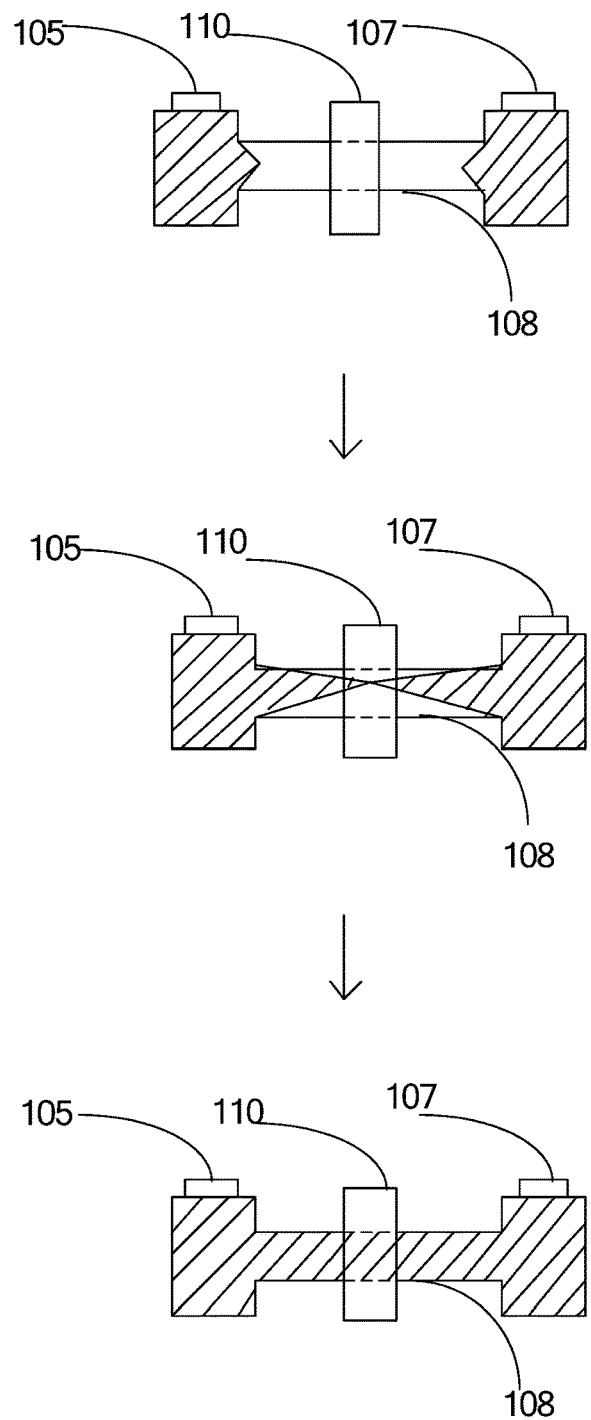
FIG. 2 is a schematic diagram of an electron distribution status of the channel nanowire when the junctionless nanowire transistor shown in FIG. 1 is operating.

The junctionless nanowire transistor of the present embodiment utilizes a voltage on the gate electrode 110 to control a current of the channel nanowires 108. The specific principle can refer to FIG. 2. When the voltage of the gate electrode 110 is less than a threshold voltage, a channel of the channel nanowires 108 is under an electron depletion status. At this time, if a voltage difference between the source electrode 105 and the drain electrode 107 is not over a breakdown voltage, the transistor is under a disconnected status. When the voltage of the gate electrode 110 is equal to the threshold voltage, a center location of the channel of the channel nanowires 108 has an electron concentration. If a voltage difference between the source electrode 105 and the drain electrode 107 is existed, the transistor is under a conduction status, which has a current. When the voltage of the gate electrode 110 is greater than the threshold voltage, the channel of the channel nanowires 108 is wider. When the voltage of the gate electrode 110 is far greater than the threshold voltage, the channel of the channel nanowires 108 function as a simple resistor, and the current reach a peak value.

Figure 3:
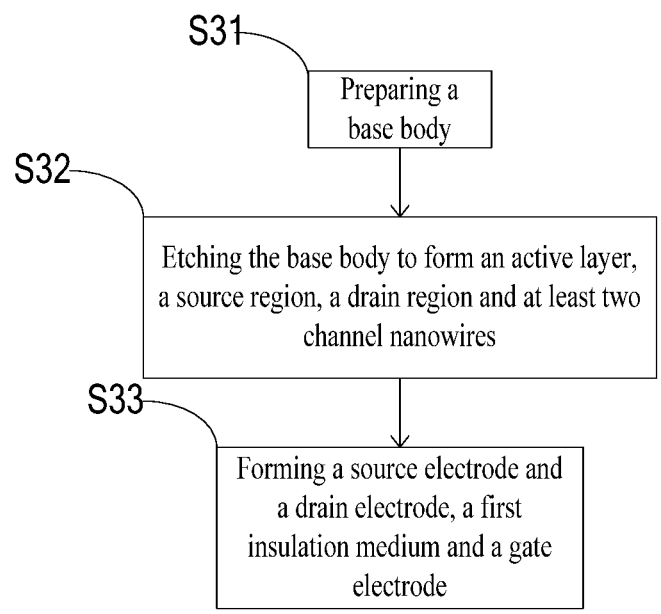
FIG. 3 is a flow chart of a manufacturing method for the junctionless nanowire transistor of the embodiment in FIG. 1.

With reference to FIG. 3, the junctionless nanowire transistor of the above embodiment can be manufactured by the following method:

Step S31: preparing a base body 401.

Figure 4:
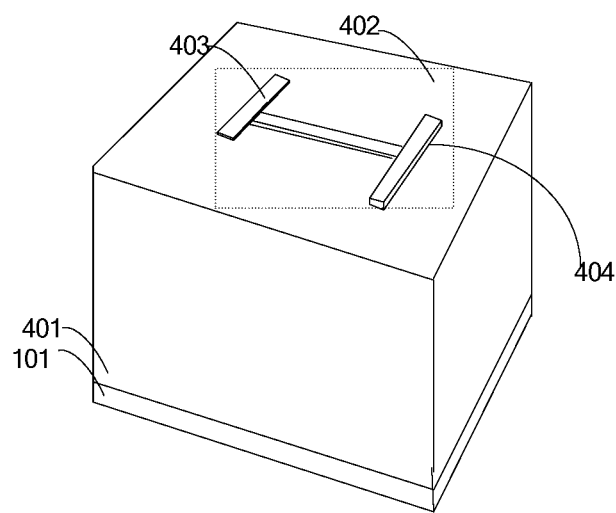
FIG. 4 is a schematic diagram of the junctionless nanowire transistor before an active layer is etched of the embodiment in FIG. 1.

As shown in FIG. 4, the base body 401 is formed after doping a first semiconductor material on an upper layer of a first semiconductor material. The base body 401 performs an annealing treatment at a high temperature, and performs an ion activation.

In an application, the doping type of the base body 401 is an N type. In another application, a P type can be adopted according to a specific requirement of the junctionless nanowire transistor, and the present invention is not limited.

Step S32: etching the base body 401 in order to form the active layer 102, the source region 104, the drain region 106 and the at least two channel nanowires 108, 109, 113. Wherein, the source region 104 and the drain region 106 are disposed on the active layer 102. The at least two channel nanowires 108, 109, 113 are disposed on the active layer 102 in a stacked arrangement, and two terminals of each of the least two channel nanowires are respectively connected with the source region 104 and the drain region 106.

Specifically, as shown in FIG. 4. Using an etching gas corresponding to a polymer 403 to etch the base body 401 in order to form the source region 104, the drain region 106 and the at least two nanowires for channel 108, 109, 113.

Wherein, the number of the cycles for etching the base body 401 decides the number of the channel nanowires obtained. When the number of the channel nanowires is greater, an on-state current of the transistor is greater.

In an application, the number of the cycles for etching the base body 401 is three so that three channel nanowires 108, 109, 113 are obtained. In another application, the number of the cycles for etching the active layer 102 can be changed according to a specific requirement for manufacturing the junctionless nanowire transistor.

Step S33: respectively forming a source electrode 105 and a drain electrode 107 on the source region 104 and the drain region 106, and sequentially forming a first insulation medium (not shown) and a gate electrode 110 outside the at least two channel nanowires 108, 109, 113 such that the first insulation medium is disposed between the at least two channel nanowires 108, 109, 113 and the gate electrode 110.

Figure 5:
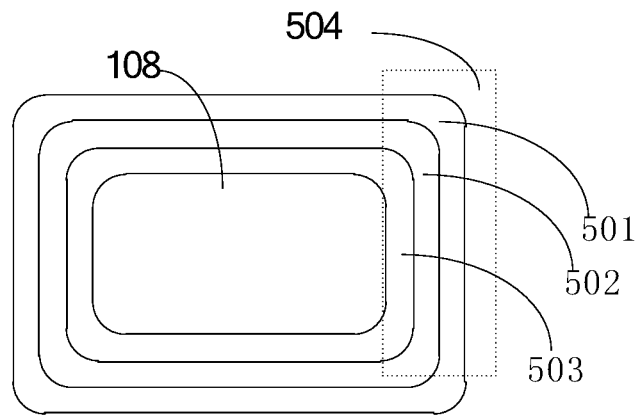
FIG. 5 is a cross-sectional diagram of an ONO structure surrounding the channel nanowires of the embodiment in FIG. 1.

In an application, using a chemical vapor deposition (CVD) to deposit an ONO structure (oxide 501-nitride 502-oxide 503) shown in FIG. 5 as a first insulation medium 504, and the first insulation medium 504 surrounds the channel nanowires 108, 109, 113. FIG. 5 shows that the first insulation medium 504 surrounds the nanowires for channel 108. Then, using the CVD to deposit a second semiconductor material as a gate electrode 110, the source electrode 105 and the drain electrode 107. Wherein, the gate electrode 110 completely encloses the first insulation medium 504, and the source electrode 105 and the drain electrode 107 are respectively disposed at the source region 104 and the drain region 106.

In another application, the manufacturing steps for the gate electrode 110, the source electrode 105 and the drain electrode 107 are performed synchronously. In another application, the above steps can also be performed asynchronously, the present invention is not limited.

Figure 6:
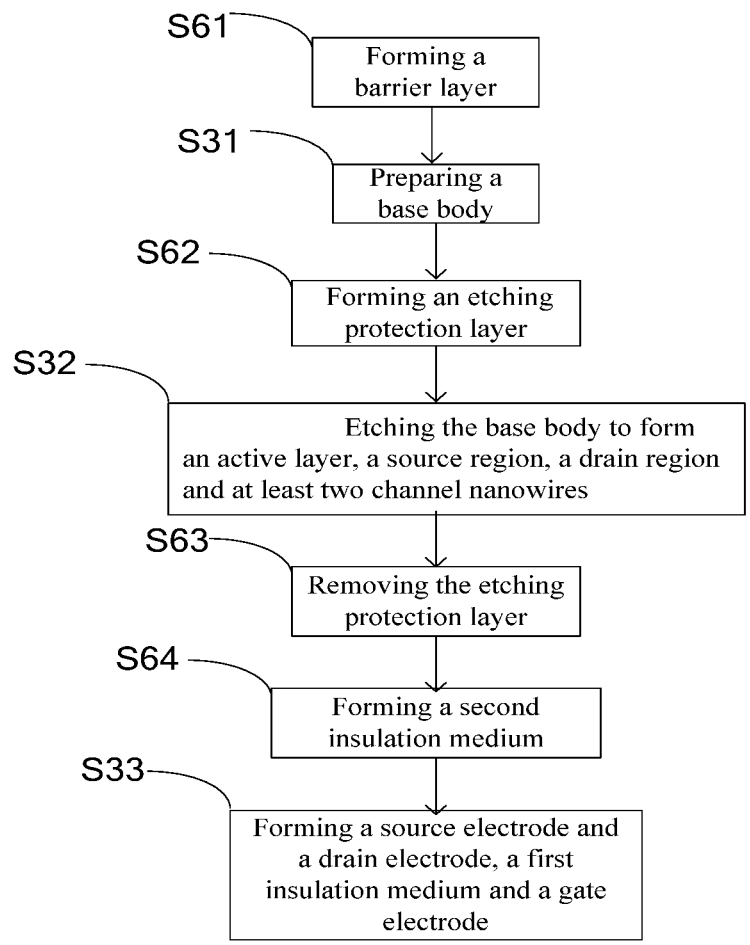
FIG. 6 is a flow chart of another manufacturing method for the junctionless nanowire transistor.

With reference to FIG. 6, optionally, before the step S31, the present invention further comprises a step of:

Step S61: forming a barrier layer 101, the barrier layer 101 is located at a side of the active layer 102 away from the source region 104 and the drain region 106.

Figure 7:
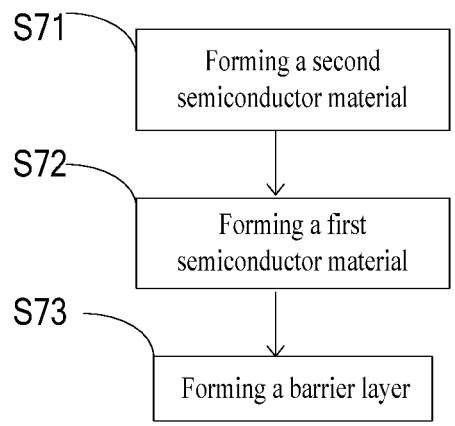
FIG. 7 is a flow chart of specific steps of the step S61 of the embodiment in FIG. 6.

Optionally, with reference to FIG. 7, the step S61 further comprises steps of:

Step S71: depositing a second semiconductor material on a glass substrate or a PI substrate using CVD.

Step S72: obtaining a first semiconductor material from the second semiconductor material through an excimer-laser annealing (ELA).

Step S73: a lower layer of the first semiconductor material functions as a barrier layer 101 after doping, and mainly used for resisting a leakage current when an ion implantation is performed at an upper layer of the first semiconductor material.

With reference to FIG. 6, optionally, after the step S31 and before the step S32, the present invention further comprises:

Step S62: forming an etching protection layer 402, as shown in FIG. 4. The etching protection layer 402 comprises a patterned etching barrier layer 404 and a polymer 403.

Figure 8:
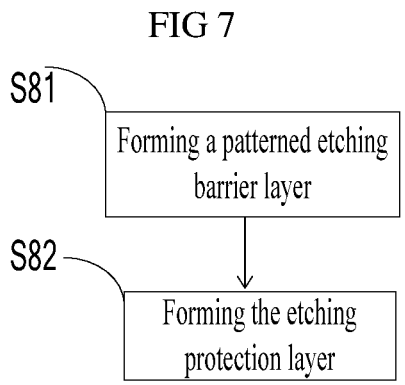
FIG. 8 is a flow chart of specific steps of the step S62 of the embodiment in FIG. 6.

Optionally, with reference to FIG. 8, the step S62 further comprises a step of:

Step S81: using a CVD to deposit an etching barrier layer 404. The etching barrier layer 404 forms a patterned etching barrier layer 404 through a photolithography and dry etching. The patterned etching barrier layer 404 covers on locations of the base body 401 where the source region 104, the drain region 106 and the channel nanowires 108 will be formed.

Step S82: covering the patterned etching barrier layer 404 with the polymer 403 in order to form the etching protection layer 402.

Wherein, the patterned etching barrier layer 404 is an oxide of the first semiconductor material.

In one application, the polymer 403 is C4F8, and in another application, the polymer 403 can be other polymers.

With reference to FIG. 6, optionally, after the step S32 and before the step S33, the present invention further comprises:

Step S63: removing the etching protection layer 402.

Step S64: forming a second insulation medium 103, and arranging the second insulation medium 103 on the active layer 102 and two sides of the gate electrode 110.

Figure 9:
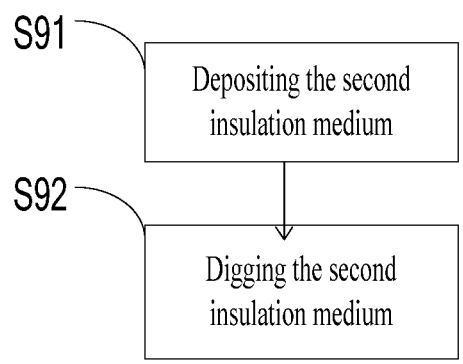
FIG. 9 is a flow chart of specific steps of the step S64 of the embodiment in FIG. 6.

Optionally, with reference to FIG. 9, the step S64 further comprises a step of:

Step S91, using CVD to deposit the second insulation medium 103, and performing a chemical mechanical polishing and planarization to the first insulation medium 103.

Figure 10:
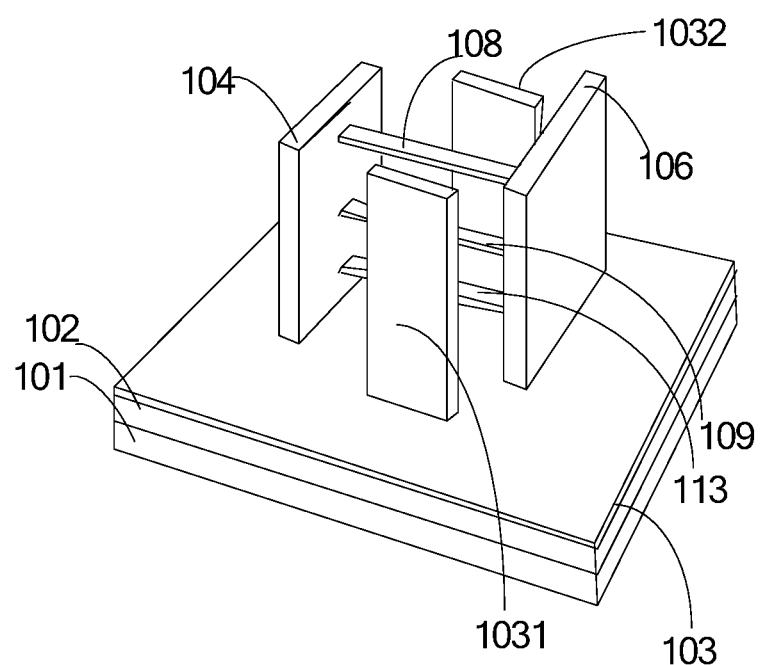
FIG. 10 is a schematic diagram of the junctionless nanowire transistor after etching the second insulation medium in the embodiment shown in FIG. 1.

Step S92: digging the second insulation medium 103, after photolithography and dry etching to remove the channel nanowires 108, 109, 113 which are disposed in a stacked arrangement, the source region 104 and the drain region 106, as shown in FIG. 10.

Wherein, the second insulation medium 103 is an oxide of the second semiconductor material. The source region 104, the drain region 106 and the nanowires 108, 109, 113 are all formed by doping a same element in the first semiconductor material such that no PN junction is existed.

Wherein, the first semiconductor material is decided according to the second semiconductor material.

In an application, the second semiconductor material is amorphous silicon (a-Si), and in another application, the second semiconductor material can be other semiconductor materials, not limited specifically.

Comparing to the conventional art, the above embodiment increases the on-state current of the transistor through disposing multiple channel nanowires; reduces the volume of the transistor through disposing the multiple channel nanowires in a stacked arrangement; solve the uniformity problem through two terminals of each of the multiple channel nanowires respectively connecting the source region, the drain region, and through the same type doping to the source region and the drain region. Through the above way, the junctionless nanowire transistor and the manufacturing method for the same of the present invention can guarantee to satisfy the on-state current of the transistor, increase the integration of the transistor and increase the uniformity of the transistor at the same time.

Comparing to the conventional art, in the above embodiment, using the first insulation medium to surround the channel nanowires, and using the gate electrode to completely enclose the first insulation medium. Through the above way, the control ability of the gate electrode to the electron concentration of the channel nanowires is enhanced, which is beneficial to increase the on-state current of the transistor and the integration of the transistor.

The above embodiments of the present invention are not used to limit the claims of this invention. Any use of the content in the specification or in the drawings of the present invention which produces equivalent structures or equivalent processes, or directly or indirectly used in other related technical fields is still covered by the claims in the present invention.

What is claimed is:

1. A junctionless nanowire transistor, comprising:
an active layer, a barrier layer, a source region, a source electrode, a drain region, a drain electrode, a gate electrode, first insulation medium and at least two channel nanowires;
wherein, the source region and the drain region are disposed on the active layer; the at least two channel nanowires are disposed above the active layer in a stacked arrangement, and two terminals of each of the at least two channel nanowires are respectively connected with the source region and the drain region; the barrier layer is located at a side of the active layer away from the source region and the drain region; the source electrode and the drain electrode are respectively disposed on the source region and the drain region; the first insulation medium is disposed between the at least two channel nanowires and the gate electrode;
the source region, the drain region and the at least two channel nanowires uses a same doping material; and
the source electrode, the drain electrode and the gate electrode are manufactured by a same material; and
the junctionless nanowire transistor further comprises a second insulation medium having a first part, a second part and a third part, wherein the first part of the second insulation medium is disposed on the active layer and surrounds bottoms of the source region, the drain region and the gate electrode so as to expose tops of the source region and the drain region, the second part and the third part of the second insulation medium are disposed at two sides of the gate electrode.

2. The transistor according to claim 1, wherein, the first insulation medium surrounds the at least two channel nanowires; and the gate electrode completely encloses the first insulation medium.

3. The transistor according to claim 1, wherein, the second insulation medium is an oxide-nitride-oxide structure.

4. The transistor according to claim 1, wherein, each of the second part and the third part of the second insulation medium disposed at two sides of the gate electrode has a height equal to that of the gate electrode.

5. The transistor according to claim 1, wherein, the first part of the second insulation medium covers all of the active layer and surrounds the bottoms of the source region, the drain region and the gate electrod.

6. The transistor according to claim 1, wherein, the source region, the drain region and the at least two channel nanowires are formed by etching a same base body.

7. A junctionless nanowire transistor, comprising:
an active layer, a source region, a source electrode, a drain region, a drain electrode, a gate electrode, first insulation medium and at least two channel nanowires;
wherein, the source region and the drain region are disposed on the active layer; the at least two channel nanowires are disposed above the active layer in a stacked arrangement, and two terminals of each of the at least two channel nanowires are respectively connected with the source region and the drain region;
the source region, the drain region and the at least two channel nanowires uses a same doping material;
the source electrode and the drain electrode are respectively disposed on the source region and the drain region; and
the first insulation medium is disposed between the at least two channel nanowires and the gate electrode; and
the junctionless nanowire transistor further comprises a second insulation medium having a first part, a second part and a third part, wherein the first part of the second insulation medium is disposed on the active layer and surrounds bottoms of the source region, the drain region and the gate electrode so as to expose tops of the source region and the drain region, the second part and the third part of the second insulation medium are disposed at two sides of the gate electrode.

8. The transistor according to claim 7, wherein, the first insulation medium surrounds the at least two channel nanowires; and the gate electrode completely encloses the first insulation medium.

9. The transistor according to claim 7, wherein, the second insulation medium is an oxide-nitride-oxide structure.

10. The transistor according to claim 7, wherein, the source electrode, the drain electrode and the gate electrode are manufactured by a same material.

11. The transistor according to claim 7, wherein, the transistor further comprises a barrier layer, and the barrier layer is located at a side of the active layer away from the source region and the drain region.

12. A manufacturing method for junctionless nanowire transistor, comprising step of:
preparing a base body;
etching the base body in order to form an active layer, a source region, a drain region and at least two channel nanowires, wherein, the source region, the drain region are disposed on the active layer, the at least two channel nanowires are disposed on the active layer in a stacked arrangement, and two terminals of each of the least two channel nanowires are respectively connected with the source region and the drain region; and
respectively forming a source electrode and a drain electrode on the source region and the drain region, and sequentially forming a first insulation medium and a gate electrode outside the at least two channel nanowires such that the first insulation medium is disposed between the at least two channel nanowires and the gate electrode;
depositing a second insulation medium and etching the second insulation medium to form a first part, a second part and a third part of the second insulation medium, wherein the first part of the second insulation medium is disposed on the active layer and surrounds bottoms of the source region and the drain region so as to expose tops of the source region and the drain region, the second part and the third part of the second insulation medium are disposed at two sides of the gate electrodes.

13. The manufacturing method for junctionless nanowire transistor according to claim 12, wherein, the first insulation medium surrounds the at least two channel nanowires; and the gate electrode completely encloses the first insulation medium.

14. The manufacturing method for junctionless nanowire transistor according to claim 12, wherein, the source electrode, the drain electrode and the gate electrode are manufactured by a same material.

15. The manufacturing method for junctionless nanowire transistor according to claim 12, wherein, before the step of preparing a base body, the method further comprises a step of:
forming a barrier layer, and the barrier layer is located at a side of the active layer away from the source region and the drain region.

16. The manufacturing method for junctionless nanowire transistor according to claim 12, wherein, after the step of etching the base body in order to form an active layer, a source region, a drain region and at least two channel nanowires and before the step of respectively forming a source electrode and a drain electrode on the source region and the drain region, and sequentially forming a first insulation medium and a gate electrode outside the at least two channel nanowires such that the first insulation medium is disposed between the at least two channel nanowires and the gate electrode, the method further comprises steps of:

removing an etching protection layer.

17. The manufacturing method for junctionless nanowire transistor according to claim 12, wherein, the second insulation medium is an oxide-nitride-oxide structure.

18. The manufacturing method for junctionless nanowire transistor according to claim 12, wherein, after the step of preparing a base body and before the step of etching the base body in order to form an active layer, a source region, a drain region and at least two channel nanowires, the method further comprises a step of:

forming an etching protection layer.

19. The manufacturing method for junctionless nanowire transistor according to claim 12, wherein, the number of the cycles for etching the base body decides the number of the channel nanowires obtained.

* * * * *